United States Patent
Furutani et al.

(10) Patent No.: US 9,338,886 B2
(45) Date of Patent: May 10, 2016

(54) SUBSTRATE FOR MOUNTING SEMICONDUCTOR, SEMICONDUCTOR DEVICE AND METHOD FOR MANUFACTURING SEMICONDUCTOR DEVICE

(71) Applicant: IBIDEN CO., LTD., Ogaki-shi (JP)

(72) Inventors: Toshiki Furutani, Ogaki (JP); Daiki Komatsu, Ogaki (JP); Masatoshi Kunieda, Ogaki (JP); Naomi Fujita, Ogaki (JP); Nobuya Takahashi, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 51 days.

(21) Appl. No.: 14/295,528

(22) Filed: Jun. 4, 2014

(65) Prior Publication Data

US 2014/0284820 A1    Sep. 25, 2014

Related U.S. Application Data

(60) Continuation of application No. 14/178,357, filed on Feb. 12, 2014, now Pat. No. 8,785,255, which is a division of application No. 13/249,838, filed on Sep. 30, 2011, now Pat. No. 8,698,303.

(60) Provisional application No. 61/416,372, filed on Nov. 23, 2010.

(51) Int. Cl.
*H01L 23/12*   (2006.01)
*H05K 1/11*    (2006.01)
*H01L 23/31*   (2006.01)
*H01L 21/56*   (2006.01)
*H01L 23/00*   (2006.01)
*H01L 23/498*  (2006.01)
*H01L 21/48*   (2006.01)

(Continued)

(52) U.S. Cl.
CPC ............ *H05K 1/113* (2013.01); *H01L 21/4857* (2013.01); *H01L 21/568* (2013.01);

(Continued)

(58) Field of Classification Search
CPC .... H05K 1/113; H05K 1/0298; H01L 23/142; H01L 23/481; H01L 23/4981; H01L 23/49827; H01L 23/49833; H01L 23/5227; H01L 23/3128; H01L 23/562; H01L 23/49822; H01L 23/147; H01L 2224/73204; H01L 2224/81192; H01L 2924/15311; H01L 2224/16227; H01L 2224/131; H01L 2924/00; H01L 23/49506
USPC .......... 257/693, E23.063, E23.068, 700–702, 257/E23.066; 174/258, 260, 262, 263
See application file for complete search history.

(56) References Cited

U.S. PATENT DOCUMENTS 5,627,406 A   5/1997   Pace
6,448,665 B1  9/2002   Nakazawa et al.

(Continued)

FOREIGN PATENT DOCUMENTS

JP   2009-117767 A   5/2009
JP   2009-212140 A   9/2009

*Primary Examiner* — Jasmine Clark
(74) *Attorney, Agent, or Firm* — Oblon, McClelland, Maier & Neustadt, L.L.P

(57) ABSTRACT

A substrate for mounting a semiconductor includes a first insulation layer having first and second surfaces on the opposite sides and having a penetrating hole penetrating through the first insulation layer, an electrode formed in the penetrating hole in the first insulation layer and having a protruding portion protruding from the second surface of the first insulation layer, a first conductive pattern formed on the first surface of the first insulation layer and connected to the electrode, a second insulation layer formed on the first surface of the first insulation layer and the first conductive pattern and having a penetrating hole penetrating through the second insulating layer, a second conductive pattern formed on the second insulation layer and for mounting a semiconductor element, and a via conductor formed in the penetrating hole in the second insulation layer and connecting the first and second conductive patterns.

20 Claims, 10 Drawing Sheets

(51) Int. Cl.
*H01L 23/14* (2006.01)
*H01L 23/28* (2006.01)
*H05K 1/02* (2006.01)

(52) U.S. Cl.
CPC ............. *H01L23/147* (2013.01); *H01L 23/28* (2013.01); *H01L 23/3128* (2013.01); *H01L 23/49822* (2013.01); *H01L 23/562* (2013.01); *H01L 24/82* (2013.01); *H05K 1/0298* (2013.01); *H01L 2224/131* (2013.01); *H01L 2224/16225* (2013.01); *H01L 2224/16227* (2013.01); *H01L 2224/32225* (2013.01); *H01L 2224/73204* (2013.01); *H01L 2224/81005* (2013.01); *H01L 2224/81192* (2013.01); *H01L 2924/00013* (2013.01); *H01L 2924/12042* (2013.01); *H01L 2924/15311* (2013.01); *H01L 2924/181* (2013.01); *H01L 2924/18161* (2013.01); *H01L 2924/351* (2013.01)

(56) References Cited

U.S. PATENT DOCUMENTS

| | | |
|---|---|---|
| 6,534,723 B1 * | 3/2003 | Asai .................. H01L 23/49811 174/255 |
| 7,071,569 B2 | 7/2006 | Ho et al. |
| 7,217,999 B1 | 5/2007 | Honda |
| 7,221,048 B2 | 5/2007 | Daeche et al. |
| 7,435,680 B2 | 10/2008 | Nakamura et al. |
| 7,825,410 B2 | 11/2010 | Mizoguchi |
| 7,841,076 B2 | 11/2010 | Fujii |
| 7,906,850 B2 | 3/2011 | Wang et al. |
| 8,039,756 B2 | 10/2011 | Kikuchi et al. |
| 8,110,754 B2 | 2/2012 | Asano |
| 8,458,900 B2 | 6/2013 | Kodani et al. |
| 8,797,757 B2 * | 8/2014 | Kaneko .................. H05K 1/113 174/260 |
| 8,957,520 B2 * | 2/2015 | Sato ....................... H01L 21/561 257/700 |
| 2002/0121689 A1 | 9/2002 | Honda |
| 2006/0226556 A1 | 10/2006 | Kurita et al. |
| 2007/0145568 A1 | 6/2007 | Ogawa |
| 2008/0188037 A1 | 8/2008 | Lin |
| 2009/0242245 A1 | 10/2009 | Asano |
| 2009/0294156 A1 | 12/2009 | Ueno et al. |
| 2010/0078205 A1 | 4/2010 | Sakai et al. |
| 2010/0132997 A1 | 6/2010 | Hando |
| 2010/0208437 A1 | 8/2010 | Maeda et al. |
| 2011/0272800 A1 | 11/2011 | Chino |

* cited by examiner

FIG. 1
(A)
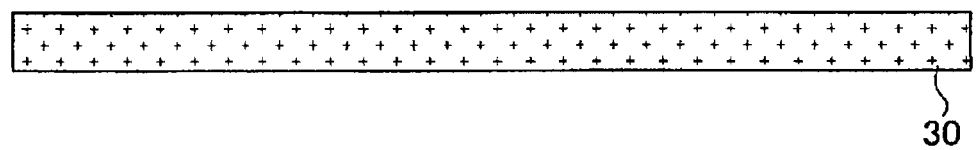
(B)
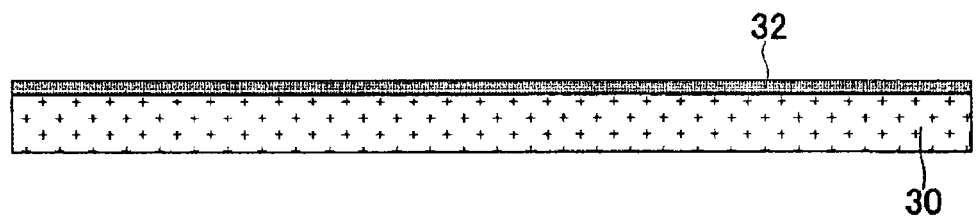
(C)
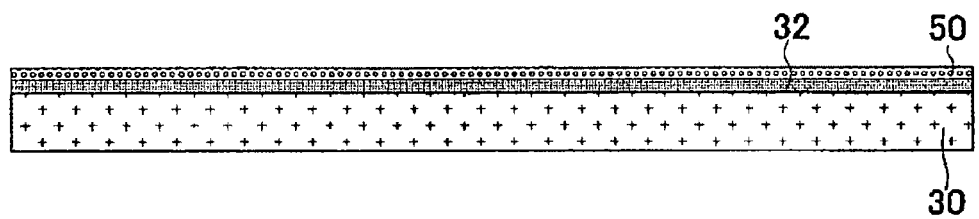
(D)
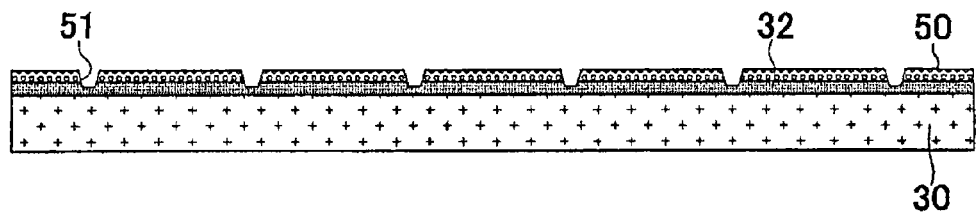

FIG. 2
(A)
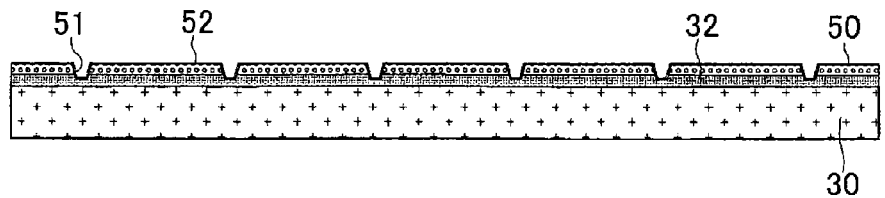
(B)
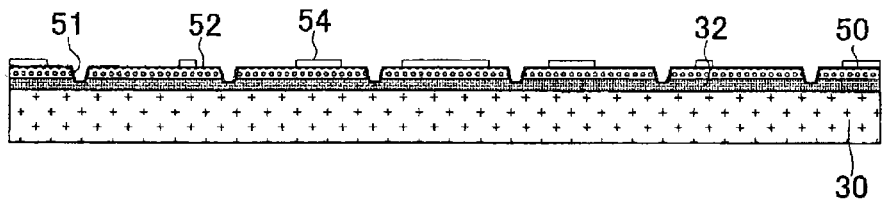
(C)
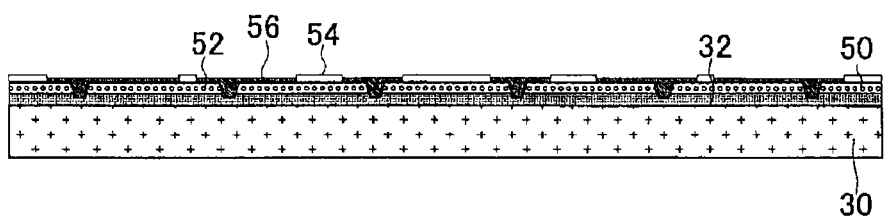
(D)
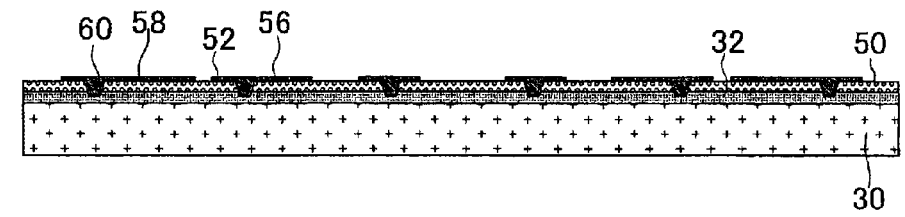

FIG. 3
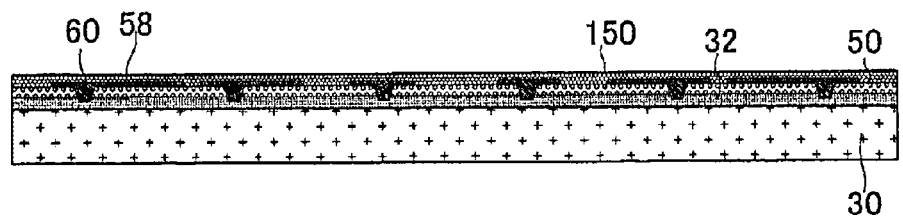
(A)
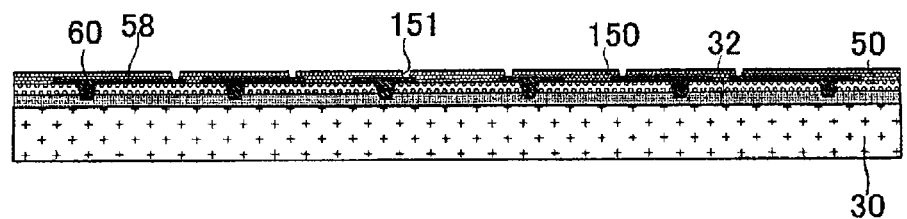
(B)
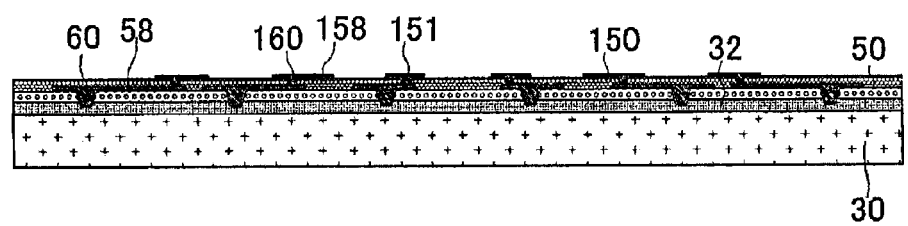
(C)
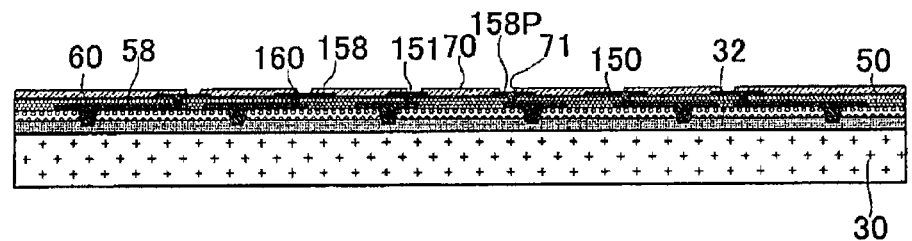
(D)

FIG. 8
(A)
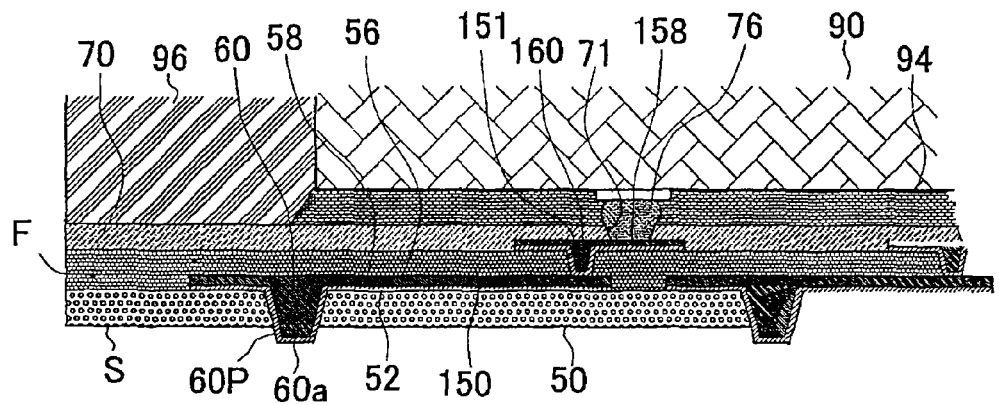
(B)
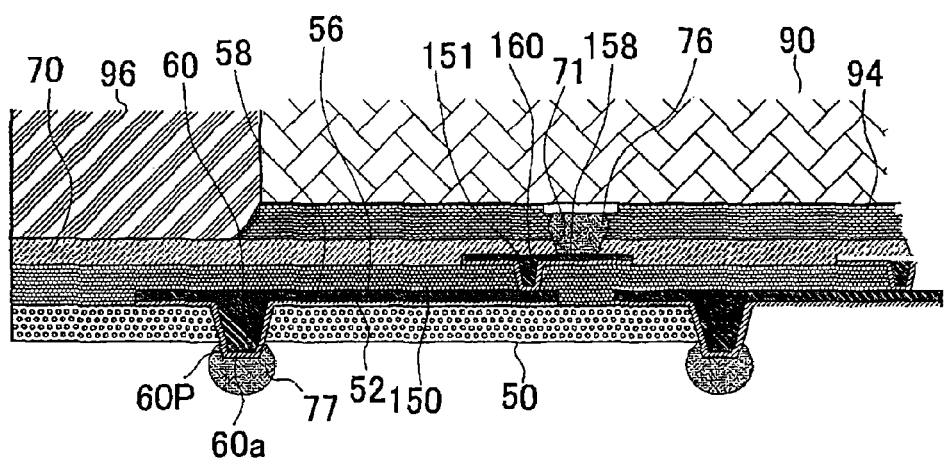

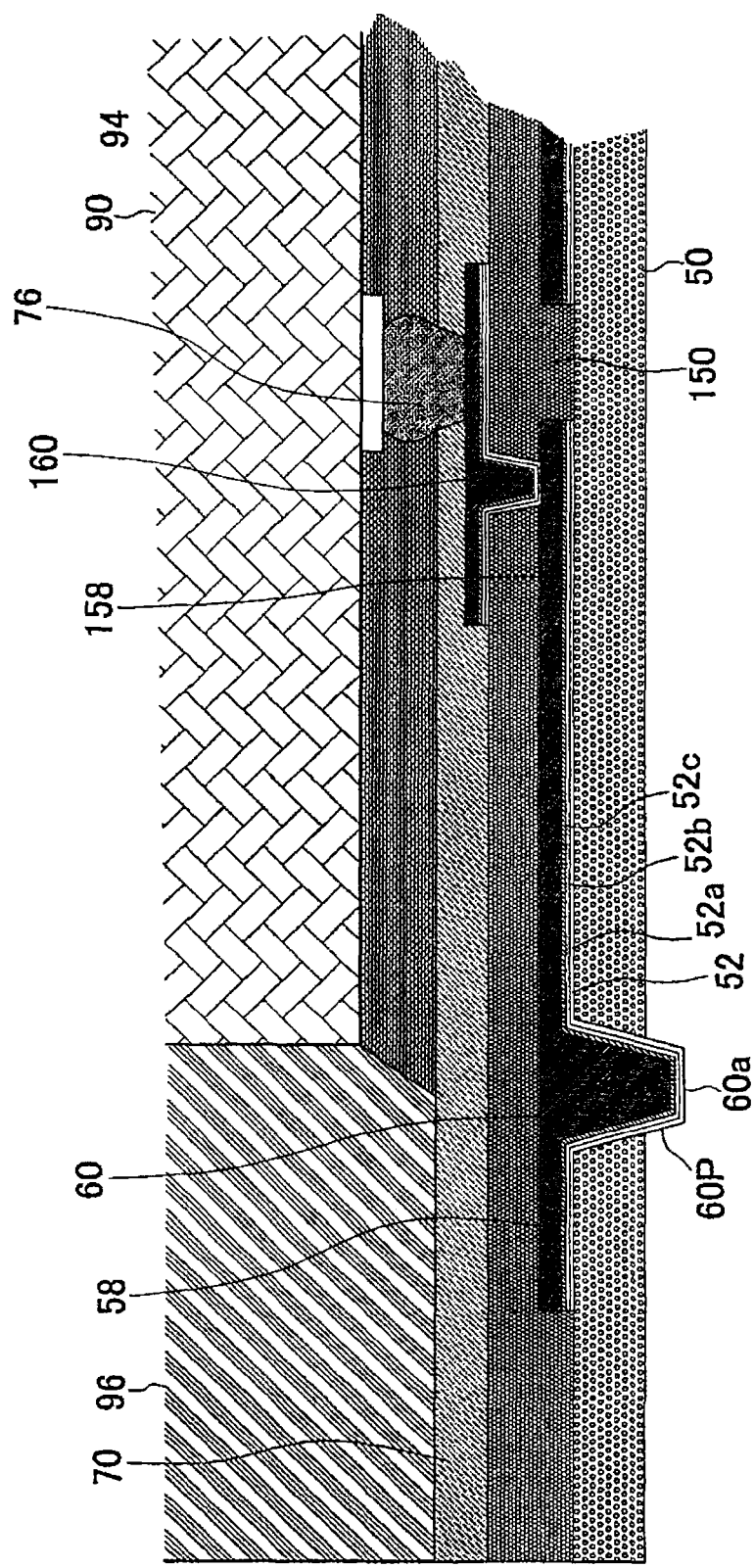

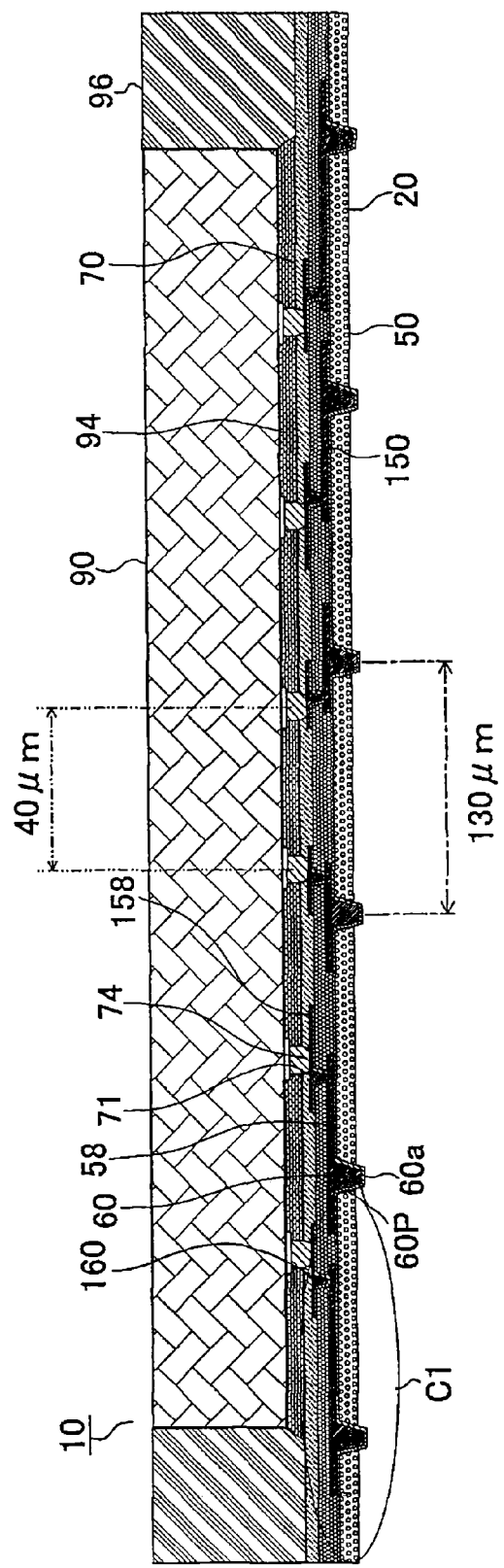

SUBSTRATE FOR MOUNTING SEMICONDUCTOR, SEMICONDUCTOR DEVICE AND METHOD FOR MANUFACTURING SEMICONDUCTOR DEVICE

CROSS-REFERENCE TO RELATED APPLICATIONS

The present application is a continuation of U.S. application Ser. No. 14/178,357, filed Feb. 12, 2014, now U.S. Pat. No. 8,785,255, issued Jul. 22, 2014, which is a divisional of U.S. application Ser. No. 13/249,838, filed Sep. 30, 2011, now U.S. Pat. No. 8,698,303, issued Apr. 15, 2014, which is based on and claims the benefit of priority to U.S. Application No. 61/416,372, filed Nov. 23, 2010. The contents of these applications are incorporated herein by reference in their entirety.

BACKGROUND OF THE INVENTION

1. Field of the Invention

The present invention relates to a semiconductor device formed by mounting a semiconductor element on a coreless printed wiring board made by laminating insulation layers and conductive patterns, and to a method for manufacturing such a device.

2. Discussion of the Background

As a package substrate for a semiconductor device, a buildup multilayer wiring board made by alternately laminating an interlayer resin insulation layer and a conductive pattern on a core substrate is used to make the substrate highly integrated. US 2008/0188037 A1 describes a method for manufacturing a coreless buildup multilayer wiring board which has electrodes made of conductive filler by filling conductive filler in recessed portions of a metal sheet, laminating insulation layers and conductive patterns on the metal sheet, and removing the metal sheet by etching. The contents of these publications (this publication) are incorporated herein by reference in their entirety.

SUMMARY OF THE INVENTION

According to one aspect of the present invention, a substrate for mounting a semiconductor includes a first insulation layer having a first surface and a second surface on the opposite side of the first surface and having a penetrating hole penetrating through the first insulation layer between the first surface and the second surface, an electrode formed in the penetrating hole in the first insulation layer and having a protruding portion protruding from the second surface of the first insulation layer, a first conductive pattern formed on the first surface of the first insulation layer and connected to the electrode, a second insulation layer formed on the first surface of the first insulation layer and the first conductive pattern and having a penetrating hole penetrating through the second insulating layer, a second conductive pattern formed on the second insulation layer and for mounting a semiconductor element, and a via conductor formed in the penetrating hole in the second insulation layer and connecting the first conductive pattern and the second conductive pattern.

According to another aspect of the present invention, a method for manufacturing a semiconductor device includes providing a support member, forming a removable layer on the support member, forming a first insulation layer on the removable layer, forming a penetrating hole which penetrates through the first insulation layer and reaches at least an intermediate point of the removable layer, forming a first conductive pattern on the first insulation layer, filling a plating material in the penetrating hole such that an electrode having a protruding portion protruding from a surface of the first insulation layer toward the intermediate point of the removable layer is formed in the penetrating hole, forming a second insulation layer on the first insulation layer such that the first conductive pattern is covered by the second insulation layer, forming on the second insulation layer a second conductive pattern for mounting a semiconductor element, mounting a semiconductor element on the second conductive pattern, separating the support member from a structure including the removable layer, the first insulation layer, the first conductive pattern, the electrode, the second insulation layer, the second conductive pattern and the semiconductor element, and removing the removable layer from the first insulation layer such that the protruding portion of the electrode protrudes from the surface of the first insulation layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 1(A)-1(D) are views showing steps for manufacturing a semiconductor device according to the first embodiment of the present invention;

FIGS. 2(A)-2(D) are views showing steps for manufacturing a semiconductor device according to the first embodiment;

FIGS. 3(A)-3(D) are views showing steps for manufacturing a semiconductor device according to the first embodiment;

FIG. 8(A) is a magnified cross-sectional view showing the inside of circle (C1) in FIG. 5(C), and FIG. 8(B) is a magnified cross-sectional view showing the inside of circle (D1) in FIG. 5(D);

FIG. 9 is a cross-sectional view of a semiconductor device according to the second embodiment; and FIG. 10 is a cross-sectional view of a semiconductor device according to the third embodiment.

DETAILED DESCRIPTION OF THE EMBODIMENTS

Figure 4:
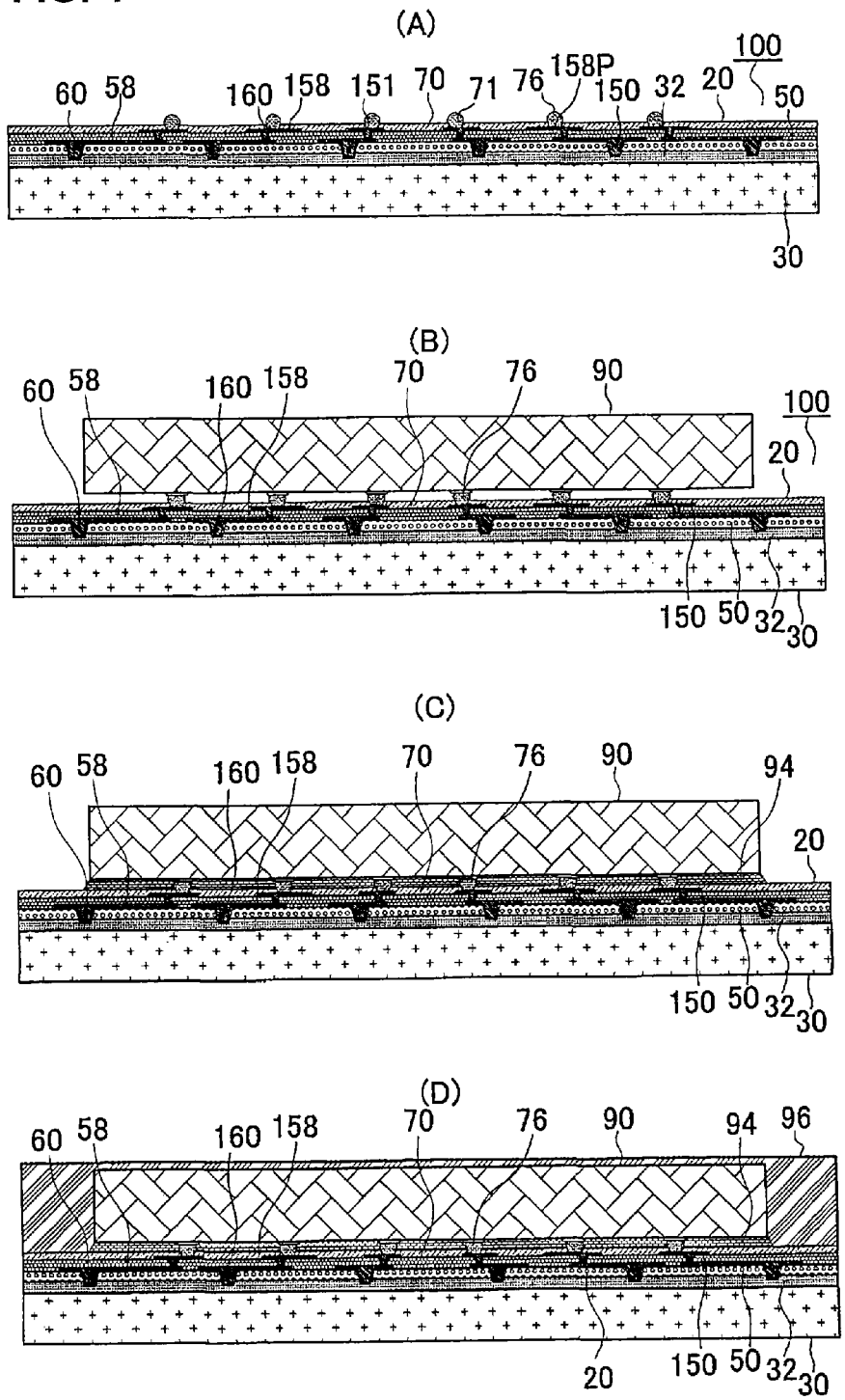
FIGS. 4(A)-4(D) are views showing steps for manufacturing a semiconductor device according to the first embodiment.
Figure 5:
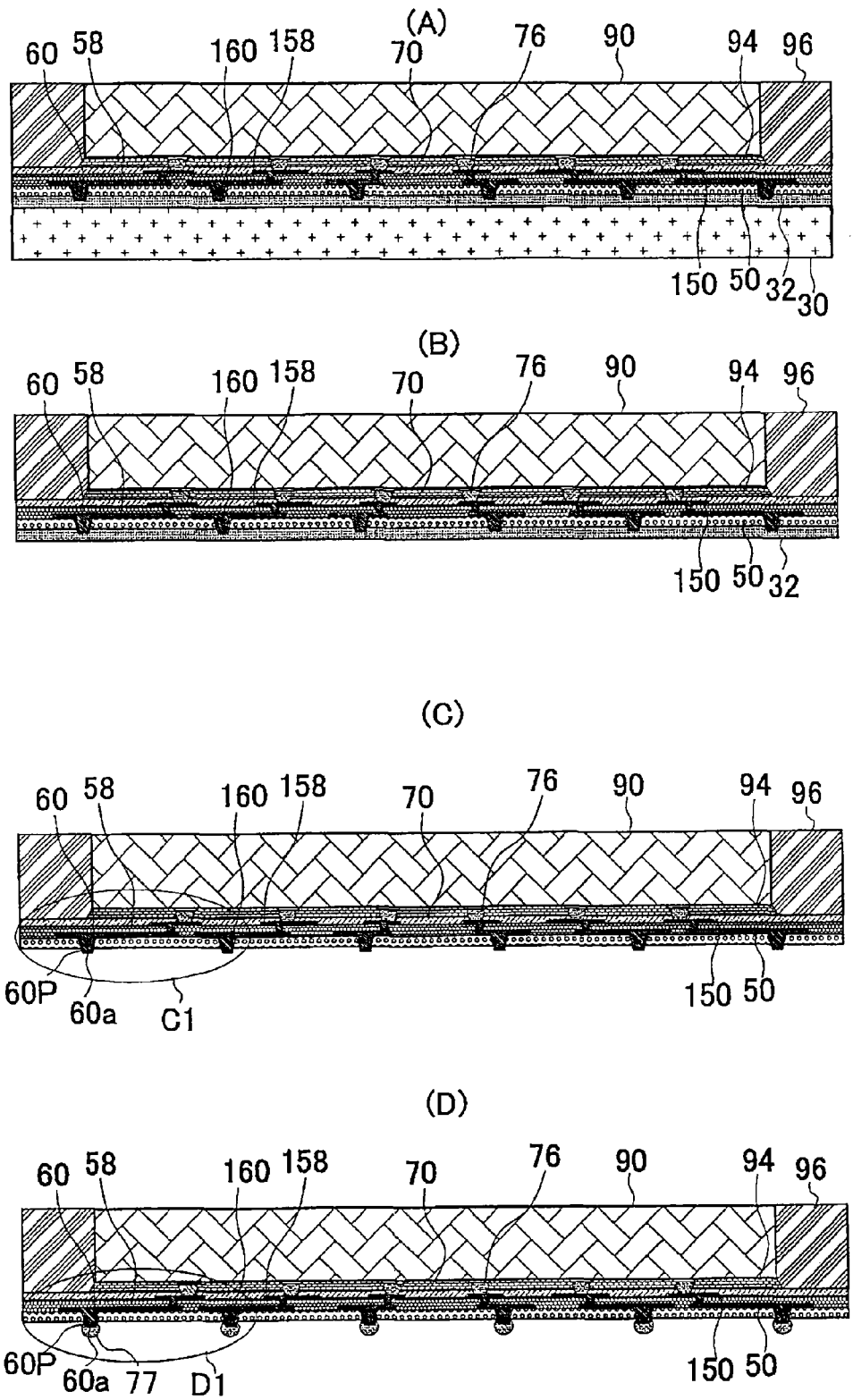
FIGS. 5(A)-5(D) are views showing steps for manufacturing a semiconductor device according to the first embodiment.

The embodiments will now be described with reference to the accompanying drawings, wherein like reference numerals designate corresponding or identical elements throughout the various drawings.

First Embodiment

Figure 7:
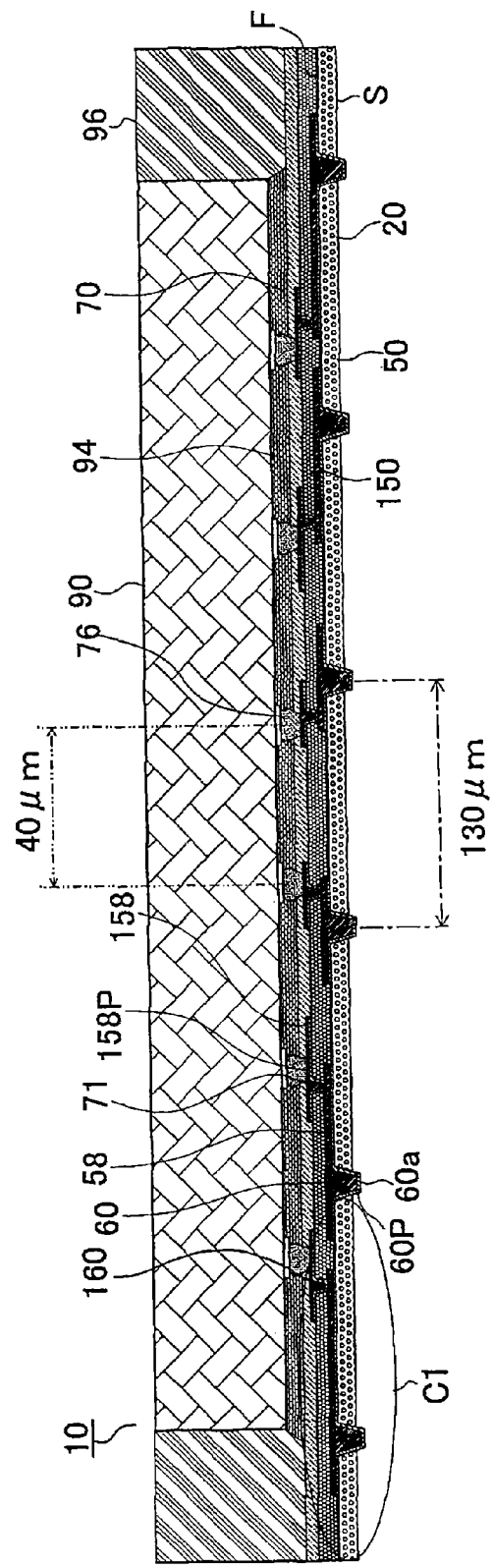
FIG. 7 is a cross-sectional view of a semiconductor device according to the first embodiment.

FIG. 7 is a cross-sectional view of semiconductor device 10 according to the first embodiment. Semiconductor device 10 is formed with substrate 20 for mounting a semiconductor made by laminating conductive patterns and insulation layers and with semiconductor element 90 mounted on substrate 20 for mounting a semiconductor. As shown in FIGS. 7 and 8(A), substrate 20 for mounting a semiconductor has first insulation layer 50 having first surface (F) and second surface (S) opposite the first surface, first conductive pattern 58 formed on first surface (F) of first insulation layer 50, second insulation layer 150 formed on the first surface of first insulation layer 50 and on first conductive pattern 58, and second conductive pattern 158 formed on second insulation layer 150. Then, penetrating holes 151 are formed in second insulation layer 150, and via conductors 160 are formed in penetrating holes 151 to connect first conductive pattern 58 and second conductive pattern 158.

First insulation layer 50 is a layer made of thermosetting resin, photosensitive resin, thermosetting resin into which a photosensitive group is introduced, thermoplastic resin, or a composite resin material containing such resins. Penetrating holes 51 are formed in first insulation layer 50. Electrodes 60 made of plating are formed in penetrating holes 51. Electrodes 60 taper with a diameter decreasing downward. Tip portions (60a) of electrodes 60 protrude from second surface (S) of first insulation layer 50. Namely, electrodes 60 have portions exposed from first insulation layer 50. Later-described solder bumps are formed at the tip portions (60a) of electrodes 60 (the portions exposed from first insulation layer 50).

Here, FIG. 8(A) is a magnified view showing the inside of circle (C1) in FIG. 7. Electrodes 60 are made of first conductive film 52 formed on the surface of first insulation layer 50 and second conductive film 56 formed on the inner side of first conductive film 52. First conductive film 52 is made of electroless copper plating and second conductive film 56 is made of electrolytic copper-plated film. Namely, in the present embodiment, electrodes 60 are formed with first conductive film 52 (electroless copper plating) and second conductive film 56 (electrolytic copper-plated film) which fills the space formed by first conductive film 52; and the first conductive film (electroless plated film) coats the second conductive film (electrolytic plated film) at the tip portions (60a) of electrodes 60 (exposed portions).

The portions of electrodes 60 protruding from first insulation layer 50 form pads (60P) for connection with an external substrate such as a printed wiring board. As shown in FIG. 8(B), solder bumps 77 are formed on pads (60P). The pitch of solder bumps 77 is set at approximately 130 µm.

First conductive pattern 58 is formed on first surface (F) of first insulation layer 50. First conductive pattern 58 is formed with first conductive film 52 (electroless plated film) on the surface of first insulation layer 50 and with second conductive film 56 (electrolytic plated film) on first conductive film 52. First conductive pattern 58 and electrodes 60 are electrically connected.

Second insulation layer 150 is formed on first surface (F) of first insulation layer 50 and on first conductive pattern 58. Second insulation layer 150 is made of the same material as that for above-described first insulation layer 50. Opening portions 151 are formed in second insulation layer 150 to expose portions of first conductive pattern 58.

Second conductive pattern 158 is formed on second insulation layer 150. Second conductive pattern 158 and first conductive pattern 58 are connected by via conductors 160 formed in opening portions 151. Second conductive pattern 158 is made of the same material as that for first conductive pattern 58, and via conductors 160 are made of the same material as that for electrodes 60.

Solder-resist layer 70 is formed on second insulation layer 150. Openings 71 are formed in solder-resist layer 70 to expose at least portions of second conductive pattern 158. Solder bumps 76 are formed in openings 71. The pitch of solder bumps 76 is set at approximately 40 µm. Then, semiconductor element 90 is mounted through solder bumps 76 on substrate 20 for mounting a semiconductor.

Underfill material 94 is filled between semiconductor element 90 and substrate 20 for mounting a semiconductor. If the planar area of the region where the underfill material is formed is referred to as "A" and the planar area of substrate 20 for mounting a semiconductor is referred to as "B", then "A" and "B" are set to be $0.75 \leq A/B \leq 0.9$. When "A/B" satisfies such a range, it is easy to fill underfill material, while warping in the semiconductor device is effectively suppressed. Semiconductor element 90 is encapsulated with encapsulating resin 96. The surface of semiconductor element 90 is exposed from encapsulating resin 96. Accordingly, heat dissipation from semiconductor element 90 is enhanced. Moreover, semiconductor device 10 is suppressed from thickening.

In the present embodiment, first insulation layer 50 is formed between lowermost first conductive pattern 58 and electrodes 60 which form pads (60P). Therefore, short circuiting seldom occurs between first conductive pattern 58 and pads (60P). In addition, if stress is exerted on the exposed portions of electrodes 60 which form pads (60P) during the process of being mounted on an external substrate, since electrodes 60 except for the exposed portions are protected by first insulation layer 50, cracks or the like seldom occur in electrodes 60. Accordingly, semiconductor device 10 of the present embodiment is highly reliable.

A method for manufacturing a semiconductor device according to the first embodiment is described with reference to FIGS. 1-8.

(1) First, glass sheet 30 with an approximate thickness of 1.1 mm is prepared (FIG. 1(A)). To decrease the difference between the thermal expansion coefficients of the glass sheet and a silicon IC chip to be mounted, the glass sheet is preferred to have a 3.3 (ppm) or less CTE and a 90% or greater transmission rate for 308 nm-laser light, which is used during the later-described removal step.

(2) Removable layer 32 made primarily of thermoplastic polyimide resin is formed on glass sheet 30 (FIG. 1(B)).

(3) Resin film for interlayer resin insulation layers (brand name: ABF-45SH made by Ajinomoto) is laminated on removal layer 32 using vacuum pressure while temperatures are raised. Accordingly, first insulation layer 50 is formed (see FIG. 1(C)). The resin film for interlayer resin insulation layers contains soluble particles and inorganic particles with a particle diameter of 0.1 µm or smaller.

(4) Using a CO2 gas laser, electrode openings 51 are formed, penetrating through first insulation layer 50 and reaching removable layer 32 (see FIG. 1(D)).

(5) By attaching a palladium catalyst or the like to the surface layer of first insulation layer 50 in advance, and through immersion in an electroless plating solution for 5~60 minutes, electroless plated film 52 is formed to be 0.1~5 µm thick (FIG. 2(A)).

(6) A commercially available dry film is laminated on electroless plated film 52, and a photomask is placed on the dry film, which is then exposed to light and developed with sodium carbonate. Accordingly, plating resist 54 with an approximate thickness of 15 µm is formed (FIG. 2(B)).

(7) Using electroless plated film 52 as a power-supply layer, electrolytic plating is performed to form electrolytic plated film 56 (FIG. 2(C)).

(8) Plating resist 54 is removed using a solution containing monoethanolamine. Then, electroless plated film 52 under the removed plating resist is dissolved and removed by etching to form first conductive pattern 58 and electrodes 60 made of electroless plated film 52 and electrolytic plated film 56 (FIG. 2(D)).

(9) Second insulation layer 150 is formed on first insulation layer 50 and on first conductive pattern 58 in a step the same as the above (3) (FIG. 3(A)).

(10) Via openings 151 reaching first conductive pattern 58 are formed in second insulation layer 150 in a step the same as the above (4) (FIG. 3(B)).

(11) Through steps the same as the above (5)~(8), via conductors 160 are formed in openings 151 in second insulation layer 150, while second conductive pattern 158 is formed on second insulation layer 150 (FIG. 3(C)). As a result, first conductive pattern 58 and second conductive pattern 158 are connected by via conductors 160.

(12) Solder-resist layer 70 is formed on second insulation layer 150. Then, openings 71 are formed in solder-resist layer 70 to expose portions of second conductive pattern 158 (FIG. 3(D)). The portions of second conductive pattern 158 exposed through openings 71 form pads (158P).

(13) Next, after Ni plating is performed on pads (158P) to raise the height, solder plating (Sn—Ag) is performed and solder bumps 76 are formed on pads (158P). Accordingly, intermediate body 100 is manufactured (FIG. 4(A)). Intermediate body 100 is made of glass sheet 30 and substrate 20 for mounting a semiconductor formed on glass sheet 30.

(14) Next, by reflowing at approximately 260° C., semiconductor element 90 is mounted on intermediate body 100 through solder bumps 76 (FIG. 4(B)). During such reflowing, stress exerted on substrate 20 for mounting a semiconductor is reduced, since the thermal expansion coefficient of glass sheet 30 is close to that of IC chip 90.

(15) Underfill 94 is filled between substrate 20 for mounting a semiconductor and semiconductor element 90 (FIG. 4(C)).

Figure 6:
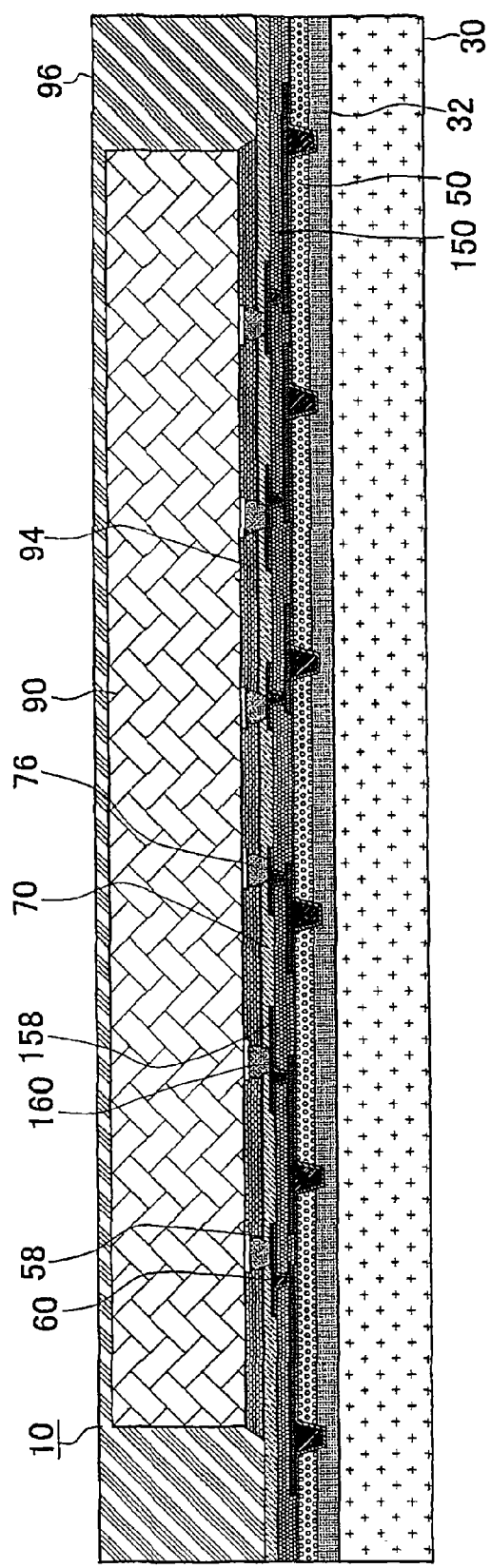
FIG. 6 is a cross-sectional view of a semiconductor device according to the first embodiment.

(16) The semiconductor element is encapsulated with resin 96 in a mold (FIG. 4(D)). FIG. 6 shows a magnified view of such a state.

(17) By polishing molded resin 96, the top surface of semiconductor element 90 is exposed (FIG. 5(A)), allowing a heat sink to be directly attached to semiconductor element 90. Moreover, the entire height of the semiconductor device is suppressed from increasing.

(18) Next, to soften removable layer 32, 308 nm-laser light is irradiated at removable layer 32 through glass sheet 30. Then, glass sheet 30 is removed by sliding glass sheet 30 off substrate 20 for mounting a semiconductor (FIG. 5(B)).

(19) Removable layer 32 is removed through ashing, and first insulation layer 50 and pads (60P) of electrodes 60 are exposed (FIG. 5(C)). FIG. 7 is a magnified view of FIG. 5(C), and circle (C1) in FIG. 7 is further magnified to be shown in FIG. 8(A).

(20) Then, solder bumps 77 are formed on pads (60P) of electrodes 60. Accordingly, a semiconductor device is completed (FIG. 5(D)). A magnified view of circle (D1) in FIG. 5(D) is shown in FIG. 8(B).

In the present embodiment, to remove glass sheet 30, a laser is irradiated through glass sheet 30 at removable layer 32 made of thermoplastic polyimide resin. Thus, glass sheet 30 is removed without exerting mechanical or thermal stress on substrate 20 for mounting a semiconductor on which semiconductor element 90 is mounted. Also, since removable layer 32 is made of thermoplastic polyimide resin, it is easy to remove the layer from buildup multilayer wiring board 20 without using a chemical.

Since the transmission rate for 308 nm-laser light in glass sheet 30 is 90% or greater, removable layer 32 is softened without heating glass sheet 30 when removing glass sheet 30. In addition, since no stress is exerted on the glass sheet, glass sheet 30 may be used again to manufacture another semiconductor device.

Electrodes 60 and first conductive pattern 58 may also have a thin-film layer so as to prevent Cu ions from being diffused between first insulation layer 50 and electroless plated film 52. Such a thin-film layer is formed with a TiN layer, a Ti layer and a Cu layer formed on first insulation layer 50 in that order. Such a thin-film layer is formed by sputtering, for example.

Second Embodiment

The structure of electrodes and conductive patterns in a substrate for mounting a semiconductor and a semiconductor device according to the present embodiment is different from that in the above first embodiment. Namely, as shown in FIG. 9, first conductive film 52 is formed with TiN layer (52a) on the insulation layer, Ti layer (52b) on the TiN layer and Cu layer (52c) on the Ti layer. Those layers are formed by sputtering, for example. In such a case, metal ions (such as Cu ions) in the patterns are suppressed from being diffused and reliability between patterns is ensured.

Third Embodiment

In a substrate for mounting a semiconductor and a semiconductor device according to the present embodiment, metal pillars 74 are formed on pads (158P) as shown in FIG. 10. Copper and solder may be used as the material for metal pillars 74. The material is not limited to any specific metal, but copper is preferred from a viewpoint of electrical resistance. In such a case, stress during the process of mounting semiconductor element 90 is effectively reduced.

A substrate for mounting a semiconductor according to an embodiment of the present invention is characterized by having the following: a first insulation layer with a first surface and a second surface opposite the first surface and having a penetrating hole; a first conductive pattern formed on the first surface of the first insulation layer; an electrode connected to the first conductive pattern and formed in the penetrating hole in the first insulation layer while protruding from the second surface of the first insulation layer; a second insulation layer formed on the first surface of the first insulation layer and on the first conductive pattern and having a penetrating hole; a second conductive pattern formed on the second insulation layer and for mounting a semiconductor element; and a via conductor formed in the penetrating hole in the second insulation layer and connecting the first conductive pattern and the second conductive pattern.

In the embodiment of the present invention, a first insulation layer is formed between the lowermost first conductive pattern and electrodes for connection with an external substrate. Thus, compared with the above-mentioned conventional art, short circuiting seldom occurs between the first conductive pattern and the electrodes. In addition, even if stress is exerted on electrode portions exposed from the first insulation layer during the process to mount the semiconductor device on an external substrate, since those electrodes except for the exposed portions are protected by the first insulation layer, cracks or the like seldom occur in the electrodes.

In the above embodiments, two insulation layers, first insulation layer 50 and second insulation layer 150, are used. However, three or more insulation layers may also be used. Also, a solder-resist layer is formed on second insulation layer 150 in the embodiments, but it is an option to form solder bumps directly without forming a solder-resist layer. In addition, as shown in FIG. 9, pillars made of copper may be formed in the openings in the solder-resist layer. Solder bumps to be used for mounting a semiconductor element are formed on such pillars. In such a case, stress exerted during the process of mounting the semiconductor element is effectively mitigated.

Obviously, numerous modifications and variations of the present invention are possible in light of the above teachings. It is therefore to be understood that within the scope of the appended claims, the invention may be practiced otherwise than as specifically described herein.

What is claimed is:

1. A substrate for mounting a semiconductor, comprising:
   a first insulation layer having a penetrating hole penetrating through the first insulation layer;
   a first conductive pattern formed on a first surface of the first insulation layer;
   an electrode formed in the penetrating hole in the first insulation layer and connected to the first conductive pattern; and
   a second insulation layer formed on the first surface of the first insulation layer and the first conductive pattern,
   wherein the electrode has a protruding portion protruding from a second surface of the first insulation layer on an opposite side with respect to the first surface of the first insulation layer and comprising a first conductive film and a second conductive film such that the first conductive film is coating the second conductive film.

2. The substrate for mounting a semiconductor according to claim 1, further comprising:
   a second conductive pattern formed on the second insulation layer; and
   a via conductor formed through the second insulation layer such that the via conductor is connecting the first conductive pattern and the second conductive pattern,
   wherein the second conductive pattern is configured to mount a semiconductor element.

3. The substrate for mounting a semiconductor according to claim 1, wherein the electrode has a side surface tapering from the first surface of the first insulation layer toward the second surface of the first insulation layer.

4. The substrate for mounting a semiconductor according to claim 1, further comprising a solder bump formed on the protruding portion of the electrode protruding from the second surface of the first insulation layer.

5. The substrate for mounting a semiconductor according to claim 1, wherein the protruding portion of the electrode is forming a pad configured to mount an external substrate.

6. The substrate for mounting a semiconductor according to claim 1, wherein the electrode and the first conductive pattern have the first conductive film and the second conductive film, and the electrode and the first conductive pattern have a thin-film layer formed between the first insulation layer and the first conductive film and configured to prevent diffusion of Cu ions between the first insulation layer and the first conductive film.

7. The substrate for mounting a semiconductor according to claim 6, wherein the thin-film layer of the electrode and the first conductive pattern comprises a TiN layer formed on the first insulation layer, a Ti layer on the TiN layer and a Cu layer formed on the Ti layer.

8. The substrate for mounting a semiconductor according to claim 6, wherein the thin-film layer of the electrode and the first conductive pattern is formed by a sputtering process.

9. The substrate for mounting a semiconductor according to claim 1, further comprising:
   a second conductive pattern formed on the second insulation layer; and
   a via conductor formed through the second insulation layer such that the via conductor is connecting the first conductive pattern and the second conductive pattern,
   wherein the second conductive pattern is configured to mount a semiconductor element, and the electrode has a side surface tapering from the first surface of the first insulation layer toward the second surface of the first insulation layer.

10. The substrate for mounting a semiconductor according to claim 1, wherein the electrode and the first conductive pattern have the first conductive film comprising an electroless plated film and the second conductive film comprising an electrolytic plated film, the first conductive film of the electrode is formed in the penetrating hole of the first insulation layer, and the second conductive film of the electrode is filling a space formed by the first conductive film in the penetrating hole of the first insulation layer.

11. A semiconductor device, comprising:
    a semiconductor element; and
    the substrate for mounting a semiconductor element according to claim 1,
    wherein the substrate has a second conductive pattern formed on the second insulation layer and a via conductor formed through the second insulation layer such that the via conductor is connecting the first conductive pattern and the second conductive pattern, and the semiconductor element is mounted on the second conductive pattern of the substrate.

12. The semiconductor device according to claim 11, wherein the semiconductor element is encapsulated with an encapsulating resin.

13. The semiconductor device according to claim 12, wherein the semiconductor element has a surface which is exposed from the encapsulating resin.

14. The semiconductor device according to claim 11, wherein the semiconductor element has a space filled with an underfill material directly under the semiconductor element.

15. The semiconductor device according to claim 11, wherein the semiconductor element has a space filled with an underfill material under the semiconductor element, the space filled with the underfill has a planar area, A, the substrate for mounting the semiconductor has a planar area, B, and the planar area, A, and the planar area, B, are set to satisfy $0.75 \leq A/B \leq 0.9$.

16. The semiconductor device according to claim 11, further comprising:
    a solder resist layer formed on the second insulation layer and the second conductive pattern such that the solder resist layer is interposed between the second conductive pattern and the semiconductor element.

17. A semiconductor device, comprising:
a semiconductor element; and
the substrate for mounting a semiconductor element according to claim 9,
wherein the semiconductor element is mounted on the second conductive pattern of the substrate.

18. The semiconductor device according to claim 17, wherein the semiconductor element has a space filled with an underfill material directly under the semiconductor element.

19. The semiconductor device according to claim 17, wherein the semiconductor element has a space filled with an underfill material under the semiconductor element, the space filled with the underfill has a planar area, A, the substrate for mounting the semiconductor has a planar area, B, and the planar area, A, and the planar area, B, are set to satisfy $0.75 \leq A/B \leq 0.9$.

20. The semiconductor device according to claim 17, further comprising:
a solder resist layer formed on the second insulation layer and the second conductive pattern such that the solder resist layer is interposed between the second conductive pattern and the semiconductor element.

* * * * *